United States Patent
Choi et al.

(10) Patent No.: US 6,753,125 B2
(45) Date of Patent: Jun. 22, 2004

(54) PHOTOSENSITIVE POLYMER HAVING FUSED AROMATIC RING AND PHOTORESIST COMPOSITION CONTAINING THE SAME

(75) Inventors: Sang-jun Choi, Seoul (KR); Yool Kang, Sungnam (KR)

(73) Assignee: Samsung Electronics, Co. LTD, Kyungki-Do (KR)

( * ) Notice: Subject to any disclaimer, the term of this patent is extended or adjusted under 35 U.S.C. 154(b) by 230 days.

(21) Appl. No.: 09/888,912

(22) Filed: Jun. 25, 2001

(65) Prior Publication Data

US 2002/0076641 A1 Jun. 20, 2002

(30) Foreign Application Priority Data

Sep. 7, 2000 (KR) .......................... 2000-53152

(51) Int. Cl.$^7$ ............................................... G03F 7/038
(52) U.S. Cl. .............................. 430/270.1; 430/286.1; 430/281.1; 430/905; 430/907; 430/910; 526/281; 549/45; 549/300
(58) Field of Search ........................... 430/270.1, 286.1, 430/281.1, 905, 907, 910, 288.1; 526/281, 327, 328.5, 318, 318.44, 320; 549/45, 300; 525/228, 241

(56) References Cited

U.S. PATENT DOCUMENTS

| | | | | |
|---|---|---|---|---|
| 4,117,239 A | * | 9/1978 | Stolka et al. | ................ 560/221 |
| 5,178,982 A | * | 1/1993 | Kato et al. | ..................... 430/96 |
| 6,045,970 A | * | 4/2000 | Choi | ....................... 430/270.1 |
| 6,316,165 B1 | * | 11/2001 | Pavelchek et al. | .......... 430/311 |
| 6,368,768 B1 | * | 4/2002 | Jung et al. | ............... 430/270.1 |
| 6,486,283 B2 | * | 11/2002 | Hong et al. | .............. 526/328.5 |
| 2002/0195419 A1 | * | 12/2002 | Pavelchek | ..................... 216/16 |

FOREIGN PATENT DOCUMENTS

JP 05024951 A * 2/1993 ........... C04B/40/00

* cited by examiner

Primary Examiner—Mark F. Huff
Assistant Examiner—Yvette C Thornton
(74) Attorney, Agent, or Firm—F. Chau & Associates, LLC

(57) ABSTRACT

A photosensitive polymer having a protecting group including a fused aromatic ring, and a photoresist composition including the photosensitive polymer are provided. The photosensitive polymer has an acid-labile protecting group at its polymer backbone, the acid-labile protecting group including a fused aromatic ring having formula:

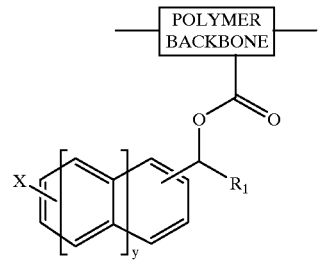

where $R_1$ is hydrogen atom or alkyl group having from 1 to 4 carbon atoms; X is hydrogen atom, halogen, alkyl, or alkoxy; and y is an integer from 1 to 3, wherein the fused aromatic ring is a liner ring or branched ring with y greater than or equal to 2.

A photoresist composition is also provided which includes the photosensitive polymer and a photoacid generator (PAG).

25 Claims, No Drawings

PHOTOSENSITIVE POLYMER HAVING FUSED AROMATIC RING AND PHOTORESIST COMPOSITION CONTAINING THE SAME

BACKGROUND OF THE INVENTION

1. Field of the Invention

The present invention relates to a photosensitive polymer and a photoresist composition, and more particularly, to a photosensitive polymer having a protecting group including a fused aromatic ring, and a photoresist composition containing the same.

2. Description of the Related Art

As the manufacture of semiconductor devices becomes more complex and current semiconductor chips are more integrated, it is essential to form fine patterns in photolithography. Furthermore, as the capacity of semiconductor devices increases to exceed 1 Gigabit, a pattern size having a design rule less than 0.2 μm is required.

In general, a photosensitive polymer is used as photoresist, which should have characteristics of: (1) high resistance to dry etching, (2) being transparent against a specific wavelength to be used, and (3) excellent adhesion to underlying layers on which patterns are formed.

A conventional photoresist typically has poor resistance to dry etching. After a photoresist pattern is formed on an underlying layer (e.g., a silicon layer) by lithography, the underlying layer is dry etched using a plasma gas. During the dry etching process, the photoresist pattern serves as a mask layer with respect to the underlying layer. As the pattern size becomes smaller, the thickness of the photoresist is gradually decreased. If the photoresist has poor resistance to dry etching, the underlying layer cannot be etched into a desired shape and the critical dimension (CD) of the underlying layer's pattern is varied. Accordingly, to ensure selectivity of the photoresist layer with respect to the underlying layer during a dry etching process, the photoresist layer must have strong resistance to dry etching.

Accordingly, it would be desirable to develop new photoresist materials having strong resistance to dry etching.

SUMMARY OF THE INVENTION

A photosensitive polymer having an acid-labile protecting group is provided. The photosensitive polymer has a general formula as follows:

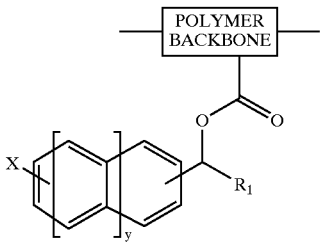

wherein the acid-labile protecting group comprises a fused aromatic ring; $R_1$ is hydrogen atom or alkyl group having from 1 to 4 carbon atoms; X is hydrogen atom, halogen, alkyl, or alkoxy; and y is an integer from 1 to 3.

According to an aspect of the invention, the acid-labile protecting group is bound to a polymer backbone of the photosensitive polymer, the polymer backbone of the photosensitive polymer includes acrylate backbone, methacrylate backbone, and norbornene backbone; the fused aromatic ring is a liner ring or branched ring with y greater than or equal to 2; the photosensitive polymers have a weight average molecular weight ranging from about 3,000 to about 200,000.

A photoresist composition is also provided which comprises: (a) a photosensitive polymer having an acid-labile protecting group represented by the formula:

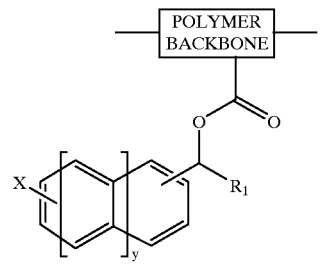

wherein the acid-labile protecting group comprises a fused aromatic ring; $R_1$ is hydrogen atom or alkyl group having from 1 to 4 carbon atoms; X is hydrogen atom, halogen, alkyl, or alkoxy; and y is an integer from 1 to 3; and (b) a photoacid generator (PAG).

According to an aspect of the invention, the acid-labile protecting group is bound to a polymer backbone of the photosensitive polymer; the fused aromatic ring is a liner ring or a branched ring with y greater than or equal to 2; the photosensitive polymer has a weight average molecular weight ranging from about 3,000 to about 200,000.

According to a preferred aspect of the present invention, the photoresist composition comprises from about 0.5 to about 10 weight percent of the photoacid generator based on the weight of the photosensitive polymer. The photoacid generator is selected from the group consisting of triarylsulfonium salt, diaryliodonium salt, sulfonate, and mixtures thereof.

The photoresist composition further comprises an organic base. The organic base comprises from about 0.5 to about 50 weight percent based on the weight of the photoacid generator. The organic base is selected from the tertiary amine group consisting of triethylamine, triethanolamine, triisobutylamine, triisooctylamine, triisodecylamine, and mixtures thereof.

DETAILED DESCRIPTION OF THE INVENTION

The preferred embodiments of the present invention will be described more fully hereinafter, in which preferred embodiments of the invention are shown. This invention may, however, be embodied in many different forms and should not be construed as limited to the embodiments set forth herein; rather, these embodiments are provided so that this disclose will be thorough and complete, and will fully convey the scope of the invention to those skilled in the art.

The present invention provides photosensitive polymers having an acid-labile protecting group at its polymer backbone, the acid-labile protecting group including a fused aromatic ring having the following formula:

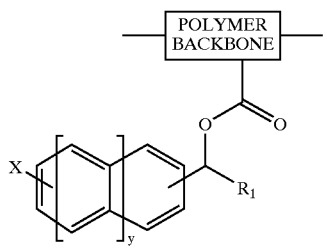

In the above formula, $R_1$ is hydrogen atom or alkyl group having from 1 to 4 carbon atoms; X is hydrogen atom, halogen, alkyl, or alkoxy; and y is an integer from 1 to 3, wherein the fused aromatic ring is a liner ring or branched ring with y greater than or equal to 2.

The photosensitive polymers of the present invention may have various molecular weights. Preferably, the photosensitive polymers have weight average molecular weight (Mw) of about 3,000 to about 200,000. More preferably, the weight average molecular weights range from about 4,000 to about 50,000.

The backbone of the photosensitive polymers according to the present invention may be varied. Representative examples of the backbone of the photosensitive polymers include acrylate backbone, methacrylate, and norbornene backbones.

According to the present invention, the photosensitive polymer is expressed by the following chemical formula (1):

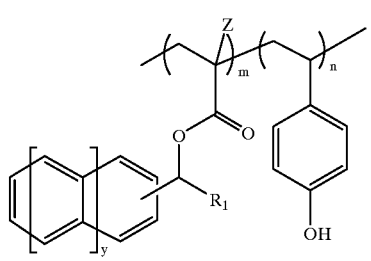

(1)

In the chemical formula (1), $R_1$ and y are the same as defined above; Z is hydrogen atom or methyl group, and the ratio of $m/(m+n)$ ranges from about 0.05 to about 0.4.

According to the present invention, the photosensitive polymer is expressed by the following chemical formula (2):

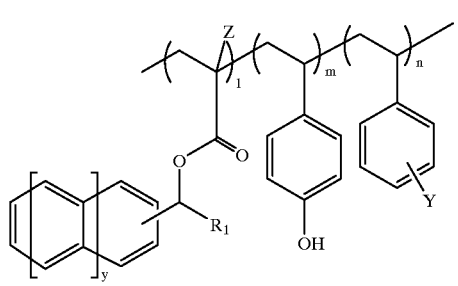

(2)

In the chemical formula (2), $R_1$, y, and Z are the same as defined above; Y is hydrogen atom, alkyl, alkoxy, or tert-butoxycarbonyloxyl group; the ratio of $l/(l+m+n)$ ranges from about 0.05 to about 0.4; and the ratio of $n/(l+m+n)$ ranges from about 0.1 to about 0.3.

According to the present invention, the photosensitive polymer is expressed by the following chemical formula (3):

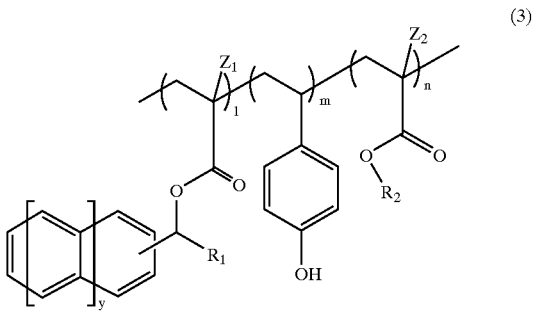

(3)

In the chemical formula (3), $R_1$ and y are the same as defined above; $R_2$ is hydrogen atom, methyl, ethyl, or tert-butyl group; $Z_1$ is hydrogen atom or methyl group; $Z_2$ is hydrogen atom or methyl group; the ratio of $l/(l+m+n)$ ranges from about 0.05 to about 0.4; and the ratio of $n/(l+m+n)$ ranges from about 0.1 to about 0.3.

According to the present invention, the photosensitive polymer is expressed by the following chemical formula (4):

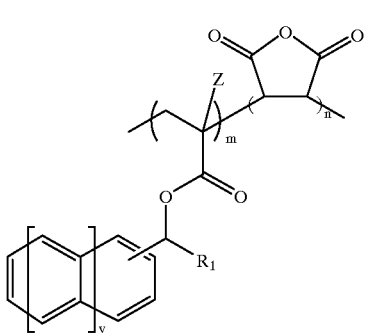

(4)

In the chemical formula (4), $R_1$, y and Z are the same as defined above; the ratio of $m/(m+n)$ ranges from about 0.5 to about 0.7; and the ratio of $n/(m+n)$ ranges from about 0.3 to about 0.5.

According to the present invention, the photosensitive polymer is expressed by the following chemical formula (5):

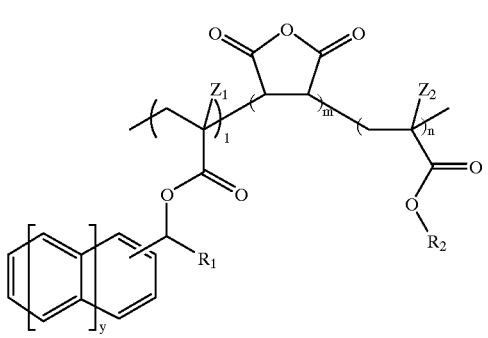

(5)

In the chemical formula (5), $R_1$, $R_2$, y, $Z_1$, and $Z_2$ are the same as defined above; the ratio of $l/(l+m+n)$ ranges from about 0.3 to about 0.6; the ratio of $m/(l+m+n)$ ranges from about 0.3 to about 0.5; and the ratio of $n/(l+m+n)$ ranges from about 0.1 to about 0.4.

According to the present invention, the photosensitive polymer is expressed by the following chemical formula (6):

(6)
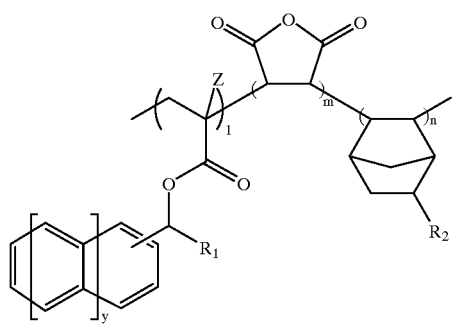

In the chemical formula (6), $R_1$, y, and Z are the same as defined above; $R_2$ is hydrogen atom, hydroxyl, carboxyl, or tert-butyl ester group; the ratio of $l/(l+m+n)$ ranges from about 0.3 to about 0.6; the ratio of $m/(l+m+n)$ ranges from about 0.3 to about 0.5; and the ratio of $n/(l+m+n)$ ranges from about 0.1 to about 0.4.

According to an embodiment of the present invention, the protecting group of the photosensitive polymer includes a variety of fused aromatic rings. Representative examples of the protecting group which can be bound easily to the backbone of the photosensitive polymer have the following chemical formulae 7 through 12:

(7)
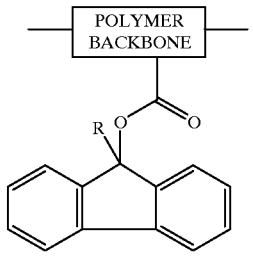

(8)
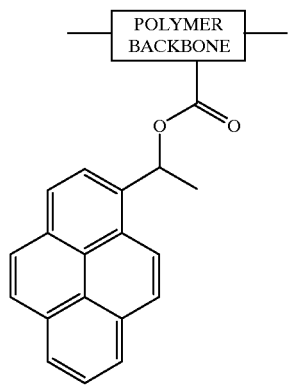

(9)
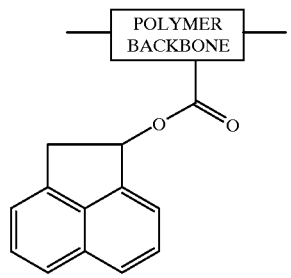

(10)
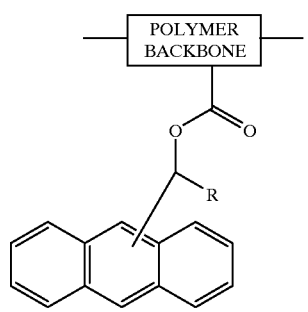

(11)
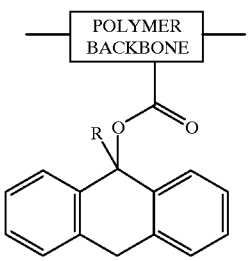

(12)
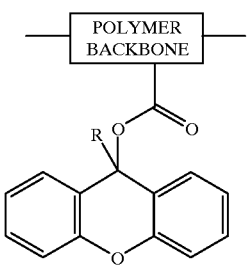

In chemical formulae 7 through 11, R is hydrogen atom or alkyl group having from 1 to 4 carbon atoms. The backbone of the photosensitive polymer according to the present invention may be varied. Representative examples of the backbone of the photosensitive polymer include (meth) acrylate and norbornene backbones.

The present invention also provides photoresist compositions. The photoresist compositions comprise: (a) a photosensitive polymer having an acid-labile protecting group at its polymer backbone, wherein the acid-labile protecting group including a fused aromatic ring having the following formula:

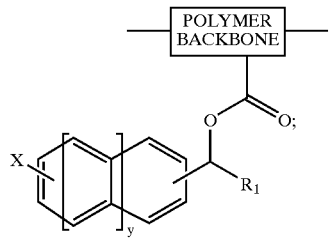

and (b) a photoacid generator (PAG).

In the above formula, $R_1$ is hydrogen atom or alkyl group having from 1 to 4 carbon atoms; X is hydrogen atom, halogen, alkyl, or alkoxy; and y is an integer from 1 to 3, wherein the fused aromatic ring is a liner ring or branched ring with y greater than or equal to 2.

Various photoacid generators may be used in the photoresist compositions. Preferably, the photoacid generators are selected from the group consisting of triarylsulfonium salt, diaryliodonium salt, sulfonate, and mixtures thereof. The photoacid generators may be used in various amounts in the photoresist composition. Preferably, the photoresist compositions include from about 0.5 to about 10 weight percent of the photoacid generators based on the weight of the photosensitive polymer. The photoresist compositions further comprise an organic bases in an amount of from about 0.5 to about 50 weight percent based on the weight of the photoacid generator. More preferably, the organic bases are selected from the tertiary amine group consisting of triethylamine, triisobutylamine, triisooctylamine, triisodecylamine, triethanolamine, and mixtures thereof.

The photosensitive compositions comprise the photosensitive polymer which is selected from the group consisting of:

(a) a photosensitive polymer having the formula:

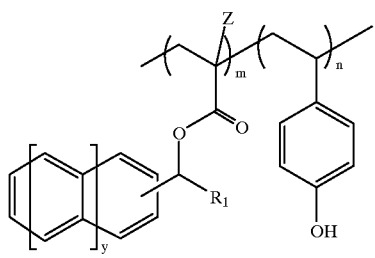

wherein $R_1$ is hydrogen or alkyl group having 1 to 4 carbon atoms; y is an integer from 1 to 3; Z is hydrogen atom or methyl group; the ratio of $m/(m+n)$ ranges from 0.05 to 0.4; the ratio of $n/(m+n)$ ranges from 0.6 to 0.95; and the photosensitive polymer has an average molecular weight ranging from about 3,000 to about 50,000;

(b) a photosensitive polymer having the formula:

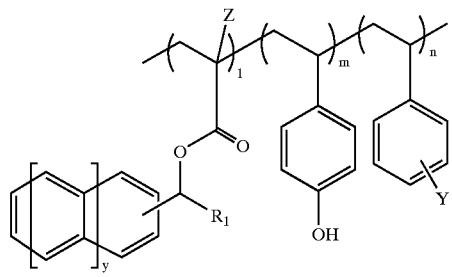

wherein $R_1$ is hydrogen or alkyl group having 1 to 4 carbon atoms; Y is hydrogen, alkyl, alkoxy, or tert-butoxycarbonyloxyl group; y is an integer from 1 to 3; Z is hydrogen atom or methyl group; the ratio of $l/(l+m+n)$ ranges from 0.05 to 0.4; the ratio of $m/(l+m+n)$ ranges from 0.3 to 0.85; the ratio of $n/(l+m+n)$ ranges from 0.1 to 0.3, and the photosensitive polymer has an average molecular weight ranging from about 3,000 to about 50,000;

(c) a photosensitive polymer having the formula:

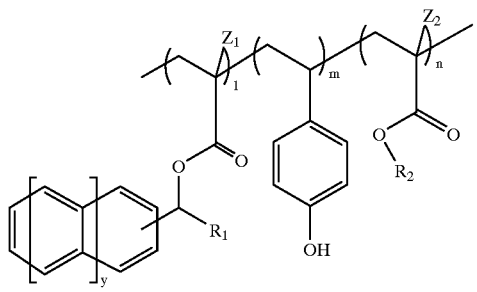

wherein $R_1$ is hydrogen or alkyl group having 1 to 4 carbon atoms; $R_2$ is hydrogen, methyl, ethyl, or tert-butyl group; y is an integer from 1 to 3; $Z_1$ is hydrogen atom or methyl group; $Z_2$ is hydrogen or methyl group; the ratio of $l/(l+m+n)$ ranges from 0.05 to 0.4; the ratio of $m/(l+m+n)$ ranges from 0.3 to 0.85; and the ratio of $n/(l+m+n)$ ranges from 0.1 to 0.3; and the photosensitive polymer has an average molecular weight ranging from about 3,000 to about 50,000;

(d) a photosensitive polymer having the formula:

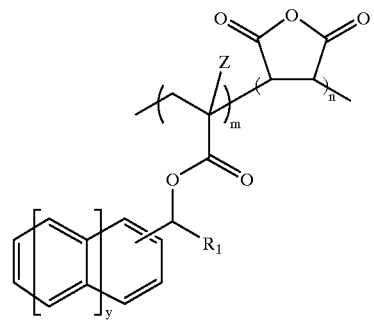

wherein $R_1$ is hydrogen or alkyl group having 1 to 4 carbon atoms; y is an integer from 1 to 3; Z is hydrogen or methyl group; the ratio of $m/(m+n)$ ranges from 0.5 to 0.7; and the ratio of $n/(m+n)$ ranges from 0.3 to 0.5; and the photosensitive polymer has an average molecular weight from about 3,000 to about 50,000.

(e) a photosensitive polymer having the formula:

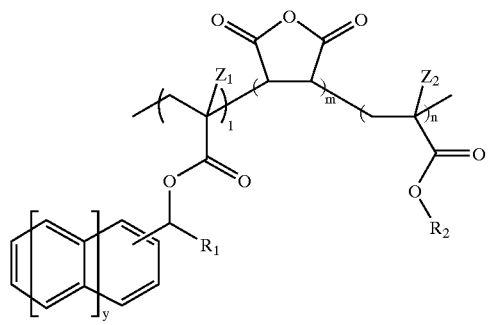

wherein $R_1$ is hydrogen or alkyl group having 1 to 4 carbon atoms; $R_2$ is hydrogen, methyl, ethyl, or tert-butyl group; y is an integer from 1 to 3; $Z_1$ is hydrogen atom or methyl group; $Z_2$ is hydrogen atom or methyl group; the ratio of $l/(l+m+n)$ ranges from 0.3 to 0.6; the ratio of $m/(l+m+n)$ ranges from 0.3 to 0.5; and the ratio of n/(l+m+n) ranges from 0.1 to 0.4, and the photosensitive polymer has an average molecular weight of 3,000–50,000; and (f) a photosensitive polymer having the formula:

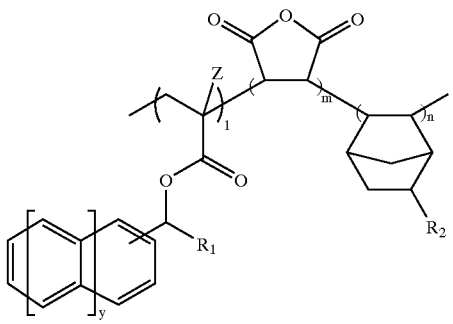

wherein $R_1$ is hydrogen or alkyl group having 1 to 4 carbon atoms; $R_2$ is hydrogen, hydroxyl, carboxyl, or tert-butyl ester group; y is an integer from 1 to 3; Z is hydrogen or methyl group; the ratio of l/(l+m+n) ranges from 0.3 to 0.6; the ratio of m/(l+m+n) ranges from 0.3 to 0.5; the ratio of n/(l+m+n) ranges from 0.1 to 0.4; and the photosensitive polymer has average molecular weight of 3,000–50,000.

Monomers or polymers which consist the photosensitive polymer according to the present invention can be easily prepared as described in the following examples.

The following examples are set forth for illustrating the invention, and are not to be interpreted as limiting thereof.

EXAMPLE 1

Synthesis of 1-naphthalenemethyl Acrylate 1-naphthalenemethyl acrylate, which is a monomer for forming a photosensitive polymer, was synthesized via the following reaction formula.

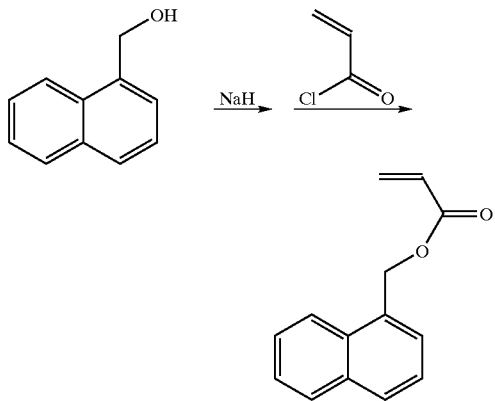

First, 0.12 mol (2.9 g) of sodium hydride was dissolved in 300 ml of anhydrous tetrahydrofuran (THF). Then, 0.11 mol (18 g) of 1-naphthalene methanol was slowly added thereto dropwise to the solution. Subsequently, the mixture reacted at room temperature for about 1 hour. After the reaction was completed, 0.1 mol (9 g) of acryloyl chloride was slowly added thereto dropwise to the reaction product at the room temperature. The mixture reacted at room temperature for about 20 hours.

After the reaction was completed, an excess of THF was removed from the reaction product. And then, the reaction product was poured into excess water, neutralized with hydrochloric acid (HCl), and extracted with diethyl ether.

The extracted product was dried using magnesium sulfate ($MgSO_4$) and then separated and purified by column chromatography (n-hexane:ethyl acetate=8:1) to obtain 1-naphthalenemethyl acrylate.

EXAMPLE 2

Synthesis of 1-naphthalenemethyl Methacrylate 1-naphthalenemethyl methacrylate was obtained in the same way as in Example 1, using 0.1 mol (8.8 g) of methacryloyl chloride instead of acryloyl chloride.

EXAMPLE 3

Synthesis of 9-anthracenemethyl Acrylate 9-anthracenemethyl acrylate was obtained in the same way as in Example 1, using 0.11 mol (21.8 g ) of 9-anthracene methanol instead of 1-naphthalene methanol.

EXAMPLE 4

Synthesis of 9-anthracenemethyl Methacrylate 9-anthracenemethyl methacrylate was obtained in the same way as in Example 1, using 0.1 mol (8.8 g) of methacryloyl chloride instead of acryloyl chloride and 0.11 mol (21.8 g ) of 9-anthracene methanol instead of 1-naphthalene methanol.

EXAMPLE 5

Synthesis of 1-naphthalene-1-ethyl Acrylate 1-naphthalene-1-ethyl acrylate, which is a monomer for forming a photosensitive polymer, was synthesized via the following reaction formula.

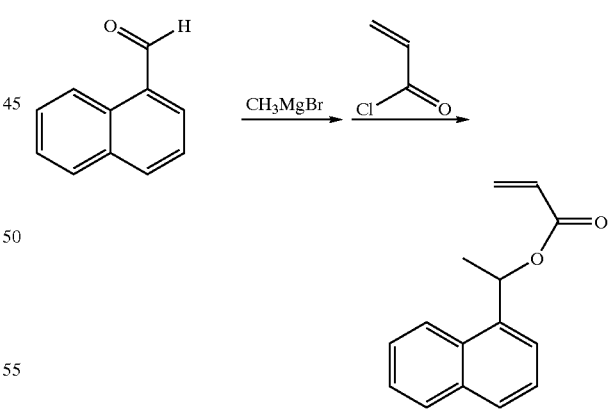

First, 0.2 mol (23.8 g) of methylmagnesium bromide was dissolved in 100 ml of anhydrous tetrahydrofuran (THF). Then, 0.15 mol (23.7 g) 1-naphthaldehyde was slowly added thereto dropwise. Subsequently, the mixture reacted at room temperature for about 4 hours. After the reaction was completed, 0.13 mol (12 g) of acryloyl chloride was slowly added thereto dropwise into the reaction product at the room temperature. The mixture reacted at room temperature for about 20 hours.

After the reaction was completed, an excess of THF was removed from the reaction product. And then, the reaction product was poured into excess water, neutralized with a diluted sulfuric acid ($H_2SO_4$) and extracted with diethyl ether.

The extracted product was dried using magnesium sulfate ($MgSO_4$) and then separated and purified by column chromatography (n-hexane:ethyl acetate=8:1) to obtain 1-naphthalene-1-ethyl acrylate with a yield of about 50%.

EXAMPLE 6

Synthesis of 1-naphthalene-1-ethyl Methacrylate 1-naphthalene-1-ethyl methacrylate was obtained in the same way as in Example 5, using 0.1 mol (8.8 g) of methacryloyl chloride instead of acryloyl chloride.

EXAMPLE 7

Synthesis of 9-anthracene-1-ethyl Acrylate 9-anthracene-1-ethyl acrylate was obtained in the same way as in Example 5, using 0.15 mol (8.8 g) of 9-anthraldehyde instead of 1-naphthaldehyde.

EXAMPLE 8

Synthesis of 9-anthracene-1-ethyl Methacrylate 9-anthracene-1-ethyl methacrylate was obtained in the same way in Example 5, using 0.1 mol (8.8 g) of methacryloyl chloride instead of acryloyl chloride and using 0.15 mol (31.5 g) of 9-anthraldehyde instead of 1-naphthaldehyde.

EXAMPLE 9

Synthesis of Homopolymer

First, 9 mmol (2 g) of 1-naphthalenemethyl acrylate synthesized in Example 1 was dissolved in 10 g anhydrous THF. 0.1 g (6 mol %) of azobisisobutyronitrile (AlBN) was added thereto and purged to with nitrogen ($N_2$) gas, thereby initiating the polymerization reaction at about 65° C. for about 20 hours. After the polymerization was completed, the reaction product was diluted with a small amount of THF, and the diluted product was slowly added thereto dropwise into an excess of n-hexane (about 10 times greater excess) to obtain a precipitation product slowly. Subsequently, the precipitation product was filtered using a glass filter, and then, the filtered product was dissolved in an appropriate amount of THF, and precipitated again with an excess of methanol (about 10 times greater excess). The precipitation product was dried in a vacuum oven at about 50° C. for about 24 hours to obtain a desired homopolymer of a yield of about 80%.

The obtained homopolymer had a weight average molecular weight (Mw) of about 21,000 and a polydispersity (weight average molecular weight(Mw)/number average molecular weight (Mn)) of about 1.9.

Each of the monomers synthesized in Examples 2 through 8 was polymerized in the same way described in Example 9 to obtain each of homopolymers. The yields of the obtained homopolymers were in the range of about 70% to about 85%.

EXAMPLE 10

Synthesis of Copolymer

The synthesis reaction of copolymer can be represented by the following formula:

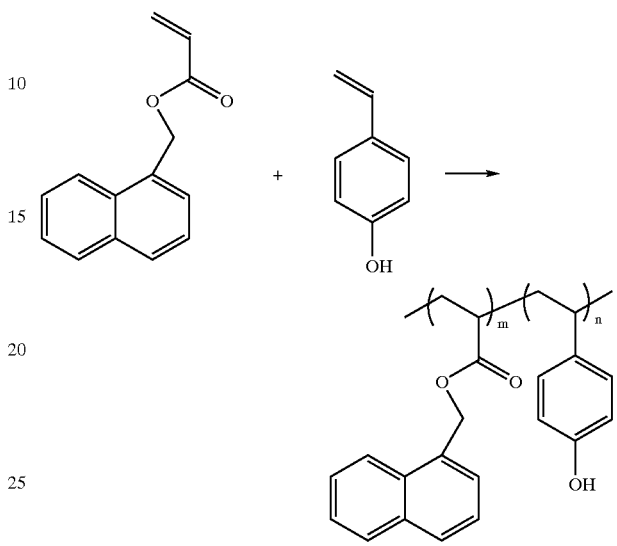

9 mmol (2 g) of 1-naphthalenemethyl acrylate synthesized in Example 1 and 21 mmol (2.5 g) of 4-hydroxystyrene were dissolved in 18 g of anhydrous THF. 0.3 g (6 mol %) of azobisisobutyronitrile (AlBN) was added thereto and was purged with nitrogen ($N_2$) gas. The polymerization reaction of the above monomer compounds was carried out at about 65° C. for about 24 hours. After the polymerization was completed, the reaction product was diluted with a small amount of THF, and the diluted product was slowly added thereto dropwise into an excess of n-hexane (about 10 times greater excess) to obtain a precipitation product. The precipitation product was filtered using a glass filter. Subsequently, the filtered product was again dissolved in an appropriate amount of THF, and was reprecipitated with an excess of n-hexane (about 10 times greater excess) to obtain a reaction product. The reprecipitation product was dried in a vacuum oven at about 50° C. for about 24 hours to obtain a desired copolymer (yield: about 85%). The obtained copolymer had a weight average molecular weight (Mw) of about 17,000, and a polydispersity (Mw/Mn) of about 2.0.

EXAMPLE 11

Synthesis of Copolymer

The synthesis reaction of copolymer can be represented by the following formula:

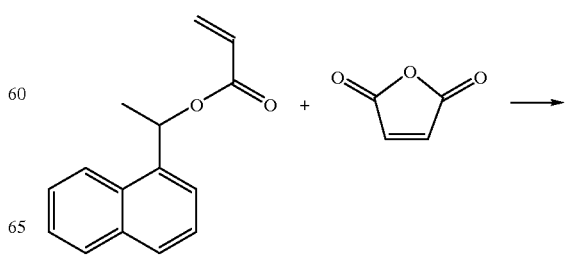

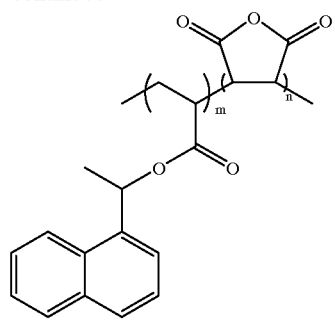

10 mmol (2.3 g) of 1-naphthalene-1-ethyl acrylate synthesized in Example 5, and 20 mmol (2 g) of maleic anhydride were dissolved in 4 g anhydrous THF. 0.25 g (5 mol %) of AIBN was added thereto and was purged with nitrogen (N₂) gas. The polymerization reaction of the above monomer compounds was carried out at about 65° C. for about 24 hours. After the polymerization was completed, the reaction product was diluted with a small amount of THF, and the diluted product was slowly added thereto dropwise into an excess of n-hexane (about 10 times greater excess) to obtain a precipitation product. The precipitation product was filtered using a glass filter. Subsequently, the filtered product was again dissolved in an appropriate amount of THF and was reprecipitated in an excess of isopropyl alcohol (about 10 times greater excess). The reprecipitation product was dried in a vacuum oven at about 50° C. for about 24 hours to obtain a desired copolymer (yield:65%).

The obtained copolymer had a weight average molecular weight (Mw) of about 11,000 and a polydispersity (Mw/Mn) of about 1.8.

EXAMPLE 12

Synthesis of Copolymer

Each of the monomers synthesized in Examples 2 through 4 was polymerized with a comonomer such as 4-hydroxystyrene, in the same way as in Example 10, to obtain copolymers.

Each of the monomers synthesized in Examples 6 through 8 was polymerized with a comonomer such as maleic anhydride, in the same way as in Example 11, to obtain copolymers.

Each of the monomers synthesized in Examples 2 through 4 and in Examples 6 through 8 was added in an amount of 20–50% by mole based on the total amount of the monomers.

EXAMPLE 13

Synthesis of Terpolymer

The synthesis reaction of a terpolymer can be represented by the following reaction formula:

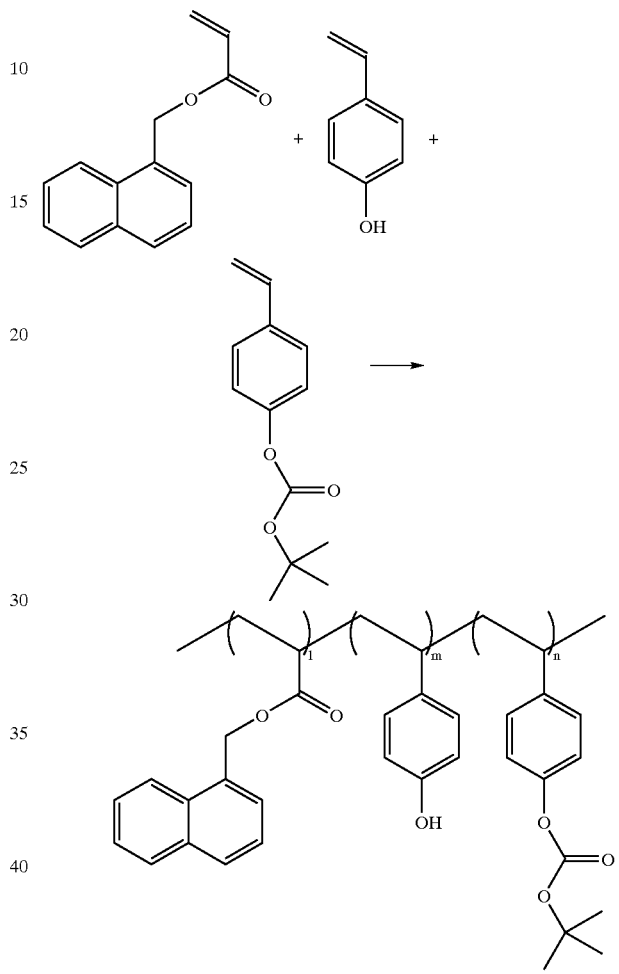

9 mmol (2 g) of 1-naphthalenemethyl acrylate synthesized in Example 1, 27 mmol (3.2 g) of 4-hydroxystyrene, and 9 mmol (2 g) of tert-butoxycarbonyloxystyrene were dissolved in 30 g anhydrous THF. 0.44 g (6 mol %) of AIBN was added thereto and was purged with nitrogen (N₂) gas. The polymerization reaction of the above monomer compounds was carried out at about 65° C. for about 24 hours. After the polymerization was completed, the reaction product was diluted with a small amount of THF, and the diluted product was slowly added thereto dropwise into an excess of n-hexane (about 10 times greater excess) to obtain a precipitation product. The precipitation product was filtered using a glass filter, and the filtered product was again dissolved in an appropriate amount of THF, and was reprecipitated in an excess of n-hexane (about 10 times greater excess). The precipitation product was dried in a vacuum oven set at 50° C. for about 24 hours to obtain a desired terpolymer (yield: about 81%).

The obtained terpolymer had a weight average molecular weight (Mw) of about 14,000, and a polydispersity (Mw/Mn) of about 1.8.

EXAMPLE 14

Synthesis of Terpolymer

The synthesis reaction of a terpolymer can be represented by the following reaction formula:

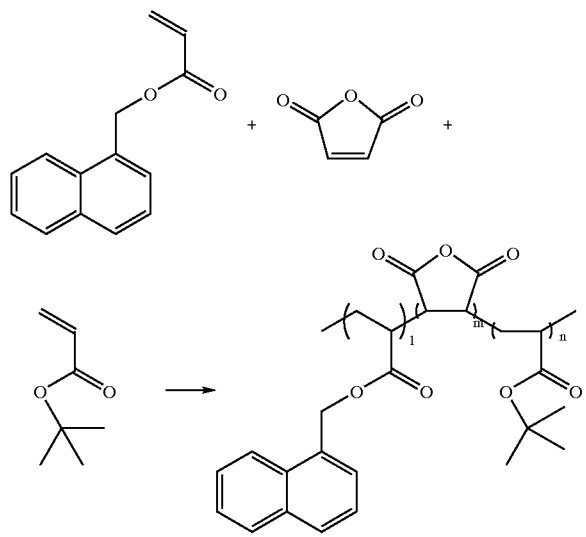

20 mmol (4.3 g) of 1-naphthalenemethyl acrylate synthesized in Example 1, 60 mmol (5.9 g) of maleic anhydride and 10 mmol (1.3 g) of tert-butylacrylate were dissolved in 12 g anhydrous THF. 0.74 g (5 mol %) of AIBN was added thereto and was purged with nitrogen ($N_2$) gas. The polymerization of the above monomer compounds was carried out at about 65° C. for about 24 hours. After the polymerization was completed, the reaction product was diluted with a small amount of THF, and the diluted product was slowly added thereto dropwise into an excess of n-hexane (about 10 times greater excess) to obtain a precipitation product. The precipitation product was filtered using a glass filter, the filtered product was again dissolved in an appropriate amount of THF, and was reprecipitated in an excess of isopropyl alcohol (about 10 times greater excess). The precipitation product was dried in a vacuum oven at about 50° C. for about 24 hours to obtain a desired terpolymer (yield: about 71%). The obtained terpolymer had a weight average molecular weight (Mw) of about 12,500, and a polydispersity (Mw/Mn) of about 1.9.

EXAMPLE 15

Synthesis of Terpolymer

Each of the monomers synthesized in Examples 2 through 8 was polymerized in the same way as in Example 13, along with 4-hydroxystyrene comonomer (first comonomer), and another comonomer (second monomer) having a different protecting group, for example, tert-butyl acrylate, tert-butyl methacrylate, or tert-butoxycarbonyloxystyrene, to obtain terpolymers. Each of the monomers synthesized in Examples 2 through 8 was added in an amount of about 10% to about 40% by mole based on the total amount of the monomers. The yields of the terpolymers were in the range of about 70% to about 80%.

EXAMPLE 16

Synthesis of Terpolymer

Monomers synthesized in Examples 1 through 8 was polymerized in the same way as in Example 13, along with maleic anhydride comonomer (first comonomer) instead of 4-hydroxystyrene comonomer, and another comonomer (second monomer) having a different protecting group, for example, tert-butyl acrylate, tert-butyl methacrylate, norbornene derivatives, or tert-butoxycarbonyloxystyrene, to obtain respective terpolymers. Each of the monomers synthesized in Examples 1 through 8 was added in an amount of about 10% to about 40% by mole based on the total amount of the monomers. The yields of the terpolymers were in the range of about 60% to about 75%.

EXAMPLE 17

Preparation of Photoresist Composition 1.0 g of one homopolymer synthesized in Example 9, and 0.03 g of triphenylsulfonium triflate as a photoacid generator (PAG) were dissolved in 8 g of propylene glycol monomethyl ether acetate (PGMEA). 3–10 mg of triisobutylamine as an organic base was added thereto for dissolving completely. The solution was stirred and filtered using membrane filters of 1.0 $\mu$m and 0.2 $\mu$m to form a photoresist composition.

The photoresist composition was coated of a silicon wafer treated with hexamethyldisilazane (HMDS) to a thickness of about 3,000 Å to about 4,000 Å.

The silicon wafers coated with the photoresist composition was pre-baked at about 120° C. to about 140° C. for about 60 seconds to about 90 seconds and exposed using a specific eximer laser stepper. Then, the silicon wafer was subjected to a post-exposure baking (PEB) at about 120° C. to about 140° C. for about 60 seconds to 90 seconds. And then, the silicon wafer were developed by dipping in a mixed solution of 30% by weight isopropyl alcohol and about 2.38 weight % of tetramethylammonium hydroxide (TMAH) solution.

EXAMPLE 18

Preparation of Photoresist Composition 1.0 g of the copolymer synthesized in Example 10, and 0.02 g of triphenylsulfonium triflate as a PAG were dissolved in 7 g of PGMEA, and 2 mg of triisobutylamine as an organic base was added thereto for dissolving completely. The solution was stirred and was filtered using membrane filters of about 1.0 $\mu$m and about 0.2 $\mu$m to form a photoresist composition.

The photoresist composition was coated of a silicon wafer treated with hexamethyldisilazane (HMDS) to a thickness of about 4,000 Å.

The silicon wafers coated with the photoresist composition was pre-baked at about 90° C., exposed using a KrF eximer laser stepper (NA=0.45 and o=0.75). Then, the silicon wafer was subjected to a post-exposure baking (PEB) at about 120° C. for about 90 seconds.

The wafer was puddle-developed using about 2.38 weight % of TMAH solution for 60 seconds to form a photoresist pattern. As a result, a 280 nm width (1:1 lines and spaces) pattern of photoresist was formed with an exposure dosage of about 35 mJ/cm$^2$ to about 40 mJ/cm$^2$.

EXAMPLE 19

Preparation of Photoresist Composition 1.0 g of the copolymer synthesized in Example 11, and 0.02 g triphenylsulfonium triflate as a PAG were dissolved in 9 g of PGMEA, and 2 mg of triisobutylamine as an organic base was added thereto for dissolving completely. The solution was stirred and was filtered using membrane filters of about 1.0 μm and about 0.2 μm to form a photoresist composition.

The photoresist composition was coated on a silicon wafer treated with HMDS to a thickness of about 2,500 Å.

The silicon wafer coated with the photoresist composition was pre-baked at about 130° C. for about 90 seconds, exposed using an ArF eximer laser stepper (NA=0.6 and o=0.75). Then, the silicon wafer was subjected to a PEB at about 120° C. for about 90 seconds.

The wafer was puddle-developed using about 2.38 weight % of TMAH solution for 60 seconds to form a photoresist pattern. As a result, a photoresist pattern having an excellent profile with 220 nm line and space arrays could be formed with an exposure energy of about 8 mJ/cm² to about 15 mJ/cm² dose.

EXAMPLE 20

Preparation of Photoresist Composition 1.0 g of the terpolymer synthesized in Example 13, and 0.02 g of triphenylsulfonium triflate as a PAG were dissolved in 7 g of PGMEA, and 3 mg of triisodecylamine as an organic base was added thereto for dissolving completely. The solution was stirred and was filtered using membrane filters of about 1.0 μm and about 0.2 μm to form a photoresist composition.

The photoresist composition was coated on a silicon wafer treated with HMDS to a thickness of about 4,000 Å.

The silicon wafer coated with the resist composition was pre-baked at about 115° C. for about 90 seconds, exposed using a KrF eximer laser stepper (NA=0.45 and o=0.75). Then, the silicon wafer was subjected to a PEB at about 110° C. for about 90 seconds.

The wafer was puddle-developed using about 2.38 weight % of TMAH solution for about 60 seconds to form a photoresist pattern. As a result, a photoresist pattern having an excellent profile with 280 nm line and space arrays could be formed with an exposure energy of about 25 mJ/cm² to about 30 mJ/cm² dose.

EXAMPLE 21

Preparation of Photoresist Composition 1.0 g of the terpolymer synthesized in Example 14, and 0.02 g of triphenylsulfonium triflate as a PAG were dissolved in 9 g of PGMEA, and 3 mg of triisodecylamine as an organic base was added thereto for dissolving completely. The solution was stirred and was filtered through membrane filters of about 1.0 μm and about 0.2 μm to form a photoresist composition.

The photoresist composition was coated on a silicon wafer treated with HMDS to a thickness of about 2,500 Å.

The silicon wafer coated with the resist composition was pre-baked at about 130° C. for about 90 seconds, exposed using an ArF eximer laser stepper (NA=0.60 and o=0.75).

Then, the silicon wafer was subjected to a PEB at about 120° C. for about 90 seconds.

The silicon wafer was puddle-developed using about 2.38 weight % of TMAH solution for 60 seconds to form a photoresist pattern. As a result, a photoresist pattern having an excellent profile with 200 nm line and space arrays could be formed with an exposure energy of about 7 mJ/cm² to about 13 mJ/cm² dose.

Exposure Mechanism

A photosensitive polymer according to the present invention is exposed by the following mechanism:

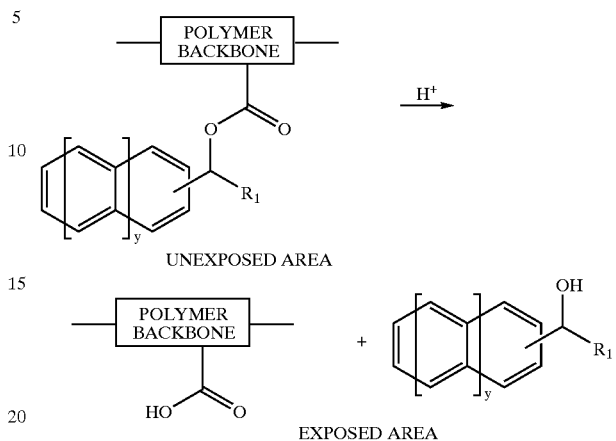

wherein $R_1$ is hydrogen atom or an alkyl group having from 1 to 4 carbon atoms, and y is an integer from 1 to 3. As described in the exposure mechanism, due to stable carbocation in the α-position of the fused aromatic ring, which is substituted in the form of an ester group, of the backbone of the photosensitive polymer, the protecting group of the photosensitive polymer is labile to hydrolyze in the presence of acid ($H^+$). When patterning a photoresist layer formed with the photoresist composition containing the photosensitive polymer according to the present invention, the exposed and unexposed areas of the resist layer have a large different solubility with respect to an alkaline developer, so that the contrast of the photoresist layer can be increased.

The photosensitive polymer according to an embodiment of the present invention has a substituting group at its backbone, which has a fused aromatic ring that provides a strong resistance to dry etching. Thus, the photosensitive polymer according to the present invention has a resistance to dry etching, and a photoresist composition formed of the photosensitive polymer can enhance contrast of the photoresist layer formed of the same, due to a large different solubility with respect to an alkaline developer, between the exposed and unexposed area.

The fused aromatic ring of the substituting group of the photosensitive polymer according to the present invention can serve as an acid-labile protecting group. The fused aromatic ring of the photosensitive polymer according to the present invention has UV absorption characteristic, so that the photoresist composition formed of the photosensitive polymer according to the present invention can be used as a photoresist material for a KrF or ArF eximer laser used as an energy source to pattern the photoresist layer.

The photoresist layer formed of a photoresist composition including the fused aromatic ring shows variable absorbency in the range of wavelength of light used for patterning the photoresist layer. Thus, the photoresist composition formed of the photosensitive polymer having a fused aromatic ring that has a peak absorbency with respect to the wavelength of light can also serve as a material for a bottom anti-reflective layer (BARL). Thus, the photoresist composition formed of the photosensitive polymer according to an embodiment of the present invention is expected to be used as a BARL material which is needed for future generation ArF lithography.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A photosensitive polymer having an acid-labile protecting group represented by the formula:

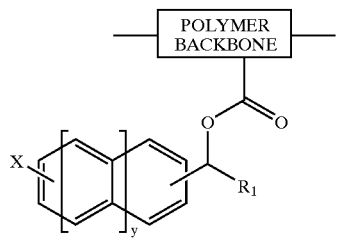

wherein the acid-labile protecting group comprises a fused aromatic ring; $R_1$ is an alkyl group having from 2 to 4 carbon atoms; X is fluorine, or an alkoxy; and y is an integer from 1 to 3.

2. The photosensitive polymer of claim 1, wherein the acid-labile protecting group is bound to a polymer to backbone of the photosensitive polymer.

3. The photosensitive polymer of claim 2, wherein the polymer backbone of the photosensitive polymer comprises acrylate backbone, methacrylate backbone and norbornene backbone.

4. The photosensitive polymer of claim 1, wherein the fused aromatic ring is a linear ring or branched ring with y greater than or equal to 2.

5. The photosensitive polymer of claim 1,
wherein the photosensitive polymer has an average molecular weight ranging from about 3,000 to about 200,000.

6. A photosensitive polymer having an acid-labile protecting group represented by the formula:

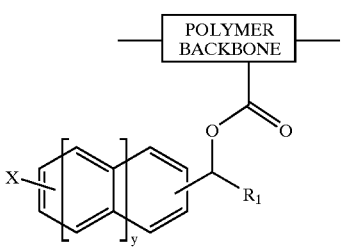

wherein the acid-labile protecting group comprises a fused aromatic ring; $R_1$ is an alkyl group having from 2 to 4 carbon atoms; X is a halogen, alkyl, or alkoxy; and wherein the fused aromatic ring is a linear ring or branched ring with y being an integer from 2 to 3, and wherein the photosensitive polymer has an average molecular weight ranging from about 10,000 to about 50,000.

7. A photosensitive polymer having a acid-labile protecting group represented by the following formula:

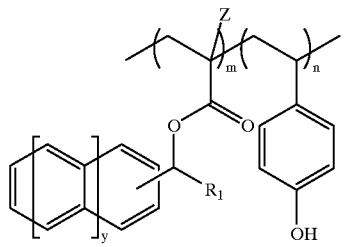

wherein $R_1$ is hydrogen or alkyl group having from 1 to 4 carbon atoms; y is an integer from 1 to 3; Z is hydrogen or methyl group; the ratio of m/(m+n) ranges from 0.05 to 0.4; the ratio n/(m+n) ranges from 0.6 to 0.95; and the photosensitive polymer has an average molecular weight ranging from about 3,000 to about 50,000.

8. The photosensitive polymer of claim 7, wherein the photosensitive polymer has the formula:

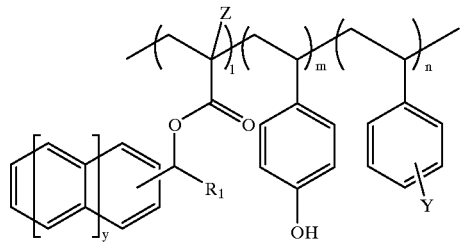

wherein $R_1$ is hydrogen or alkyl group having from 1 to 4 carbon atoms; y is an integer from 1 to 3; Y is hydrogen atom, alkyl, alkoxy, or tert-butoxycarbonyloxyl group; Z is hydrogen or methyl; the ratio of l/(l+m+n) ranges from 0.05 to 0.4; the ratio of m/(l+m+n) ranges from 0.3 to 0.85; the ratio of n/(l+m+n) ranges from 0.1 to 0.3; and the photosensitive polymer has an average molecular weight ranging from about 3,000 to about 50,000.

9. The photosensitive polymer of claim 7, wherein the photosensitive polymer has the formula:

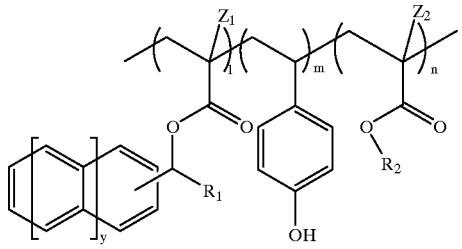

wherein $R_1$ is hydrogen or alkyl group having from 1 to 4 carbon atoms; y is an integer from 1 to 3; $R_2$ is hydrogen, methyl, ethyl, or tert-butyl group; $Z_1$ is hydrogen or methyl group, $Z_2$ is hydrogen or methyl group; the ratio of l/(l+m+n) ranges from 0.05 to 0.4; the ratio of m/(l+m+n) ranges from 0.6 to 0.95; and the ratio of n/(l+m+n) ranges from 0.1 to 0.3; and the photosensitive polymer has an average molecular weight ranging from about 3,000 to 50,000.

10. The photosensitive polymer of claim 7, wherein the photosensitive polymer has the formula:

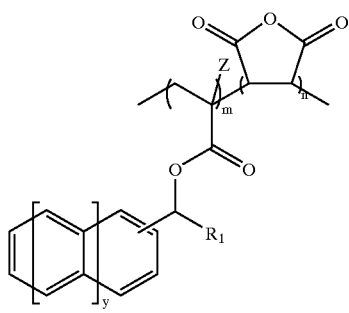

wherein $R_1$ is hydrogen or alkyl group having from 1 to 4 carbon atoms; y is an integer from 1 to 3; Z is hydrogen or methyl group; the ratio of m/(m+n) ranges from 0.5 to 0.7; and the ratio of n/(m+n) ranges from 0.3 to 0.5; and the photosensitive polymer has an average molecular weight ranging from about 3,000 to about 50,000.

11. The photosensitive polymer of claim 7, wherein the photosensitive polymer has the formula:

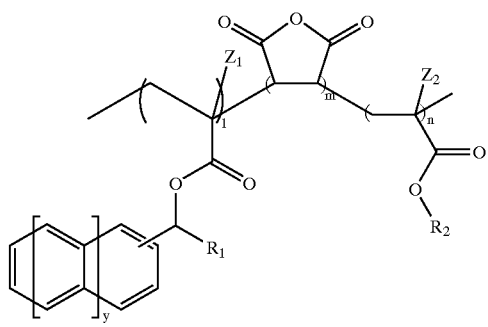

wherein $R_1$ is hydrogen or alkyl group having from 1 to 4 carbon atoms; y is an integer from 1 to 3; $R_2$ is hydrogen, methyl, ethyl, or tert-butyl group; $Z_1$ is hydrogen or methyl group; $Z_2$ is hydrogen or methyl group; the ratio of l/(l+m+n) ranges from 0.3 to 0.6; the ratio of m/(l+m+n) ranges from 0.3 to 0.5; the ratio of n/(l+m+n) ranges from 0.1 to 0.4; and the photosensitive polymer has an average molecular weight ranging from about 3,000 to about 50,000.

12. The photosensitive polymer of claim 7, wherein the photosensitive polymer has the formula:

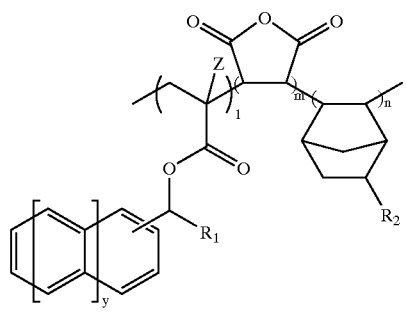

wherein $R_1$ is hydrogen or alkyl group having from 1 to 4 carbon atoms; y is an integer from 1 to 3; $R_2$ is hydrogen, hydroxyl, carboxyl, or tert-butyl ester group; Z is hydrogen or methyl group; the ratio of l/(l+m+n) ranges from 0.3 to 0.6; the ratio of m/(l+m+n) ranges from 0.3 to 0.5; the ratio of n/(l+m+n) ranges from 0.1 to 0.4; and the photosensitive polymer has an average molecular weight ranging from about 3,000 to about 50,000.

13. A photoresist composition comprising:

(a) A photosensitive polymer having an acid-labile protecting group represented by the formula:

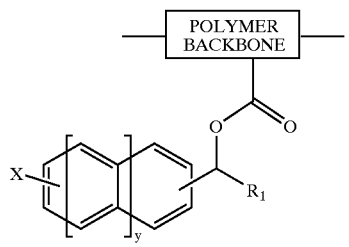

wherein the acid-labile protecting group comprises a fused aromatic ring; $R_1$ is alkyl group having from 1 to 4 carbon atoms; X is a halogen, alkyl, or alkoxy; and y is an integer from 1 to 3; and (b) a photoacid generator (PAG).

14. The photoresist composition of claim 13, wherein the acid-labile protecting group is bound to the backbone of the photosensitive polymer.

15. The photoresist composition of claim 13, wherein the fused aromatic ring is a linear ring or branched ring with y greater than or equal to 2.

16. The photoresist composition of claim 13, wherein the photoresist composition comprises from about 0.5 to about 10 weight percent of the photoacid generator based on the weight of the photosensitive polymer.

17. The photoresist composition of claim 13, wherein the photoacid generator is selected from the group consisting of triarylsulfonium salt, diaryliodonium salt, sulfonate, and a mixtures thereof.

18. The photoresist composition of claim 13, further comprising an organic base.

19. The photoresist composition of claim 13, wherein the organic base comprises from about 0.5 to about 50 weight percent based on the weight of the photoacid generator.

20. The photoresist composition of claim 19, wherein the organic based is selected from the tertiary amine group consisting of triethylamine, triethanolamine, triisobutylamine, triisooctylamine, triisodecylamine, and mixtures thereof.

21. The photoresist composition of claim 13, wherein the photosensitive polymer has an average molecular weight ranging from about 3,000 to about 200,000.

22. The photoresist composition of claim 21, further comprising a photoacid generator, wherein the photoacid generator is selected from the group consisting of triarylsulfonium salt, diaryliodonium salt, sulfonate, and mixtures thereof.

23. A photoresist composition comprising:

a photoacid generator; and a photosensitive polymer having a acid-labile protecting group, wherein the photosensitive polymer is selected from the group consisting of:

(a) a photosensitive polymer having the formula:

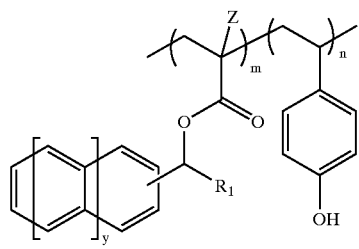

wherein $R_1$ is hydrogen or alkyl group having from 1 to 4 carbon atoms; y is an integer from 1 to 3; Z is hydrogen or methyl group; the ratio of m/(m+n) ranges from 0.05 to 0.4; the ratio of n/(m+n) ranges from 0.6 to 0.95; and the photosensitive polymer has an average molecular weight ranging from about 3,000 to about 50,000;

(b) a photosensitive polymer having the formula:

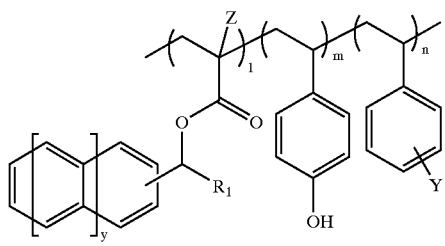

wherein $R_1$ is hydrogen or alkyl group having from 1 to 4 carbon atoms; Y is hydrogen, alkyl, alkoxy, or tert-butoxycarbonyloxyl group; y is an integer from 1 to 3; Z is hydrogen or methyl; the ratio of l/(l+m+n) ranges from 0.05 to 0.4; the ratio of m/(l+m+n) ranges from 0.3 to 0.85; the ratio of n/(l+m+n) ranges from 0.1 to 0.3; and the photosensitive polymer has an average molecular weight ranging from about 3,000 to about 50,000;

(c) a photosensitive polymer having the formula:

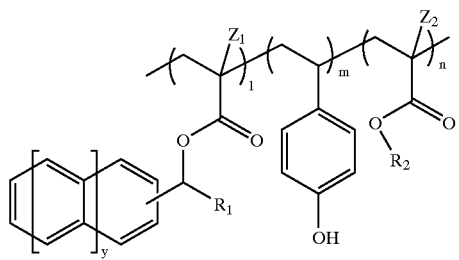

wherein $R_1$ is hydrogen or alkyl group having from 1 to 4 carbon atoms; $R_2$ is hydrogen, methyl, ethyl, or tert-butyl group; y is an integer from 1 to 3; $Z_1$ is hydrogen or methyl group; $Z_2$ is hydrogen or methyl group; the ratio of l/(l+m+n) ranges from 0.05 to 0.4; the ratio of m/(l+m+n) ranges from 0.3 to 0.85; and the ratio of n/(l+m+n) ranges from 0.1 to 0.3; and the photosensitive polymer has an average molecular weight ranging from about 3,000 to about 50,000;

(d) a photosensitive polymer having the formula:

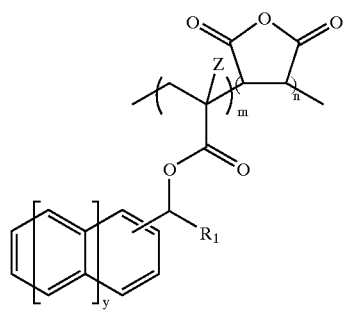

wherein $R_1$ is hydrogen or alkyl group having from 1 to 4 carbon atoms; y is an integer from 1 to 3; Z is hydrogen or methyl group; the ratio of m/(l+m+n) ranges from 0.5 to 0.7; and the ratio of n/(n+m+n) ranges from 0.3 to 0.5; and the photosensitive polymer has an average molecular weight ranging from about 3,000 to about 50,000;

(e) a photosensitive polymer having the formula:

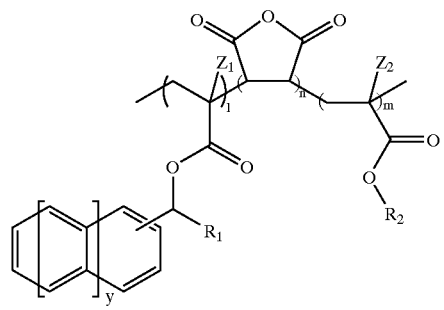

wherein $R_1$ is hydrogen or alkyl group having from 1 to 4 carbon atoms; $R_2$ is hydrogen, methyl, ethyl, or tert-butyl group; y is an integer from 1 to 3; $Z_1$ is hydrogen or methyl group; $Z_2$ is hydrogen or methyl group; the ratio of l/(l+m+n) ranges from 0.3 to 0.6; the ratio of m/(l+m+n) ranges from 0.3 to 0.5; and the ratio of n/(l+m+n) ranges from 0.1 to 0.4; and the photosensitive polymer has an average molecular weight ranging from about 3,000 to about 50,000;

(f) a photosensitive polymer having the formula:

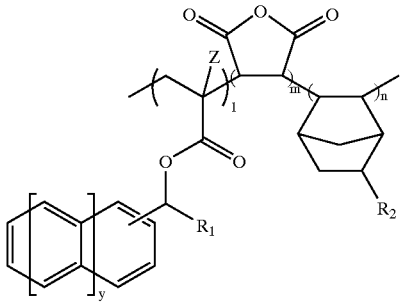

wherein $R_1$ is hydrogen or alkyl group having from 1 to 4 carbon atoms; $R_2$ is hydrogen, hydroxyl, carboxyl, or tert-butyl ester group; y is an integer from 1 to 3; Z is hydrogen or methyl group; the ratio of $l/(l+m+n)$ ranges from 0.3 to 0.6; the ratio of $m/(l+m+n)$ ranges from 0.3 to 0.5; the ratio of $n/(l+m+n)$ ranges from 0.1 to 0.4; and the photosensitive polymer has an average molecular weight ranging from about 3,000 to about 50,000.

24. The photoresist composition of claim 23, further comprising an organic base, wherein the organic base comprises from about 0.5 to about 50 weight percent based on the weight of the photoacid generator.

25. A photosensitive polymers having an acid labile protecting groups represented by formula:

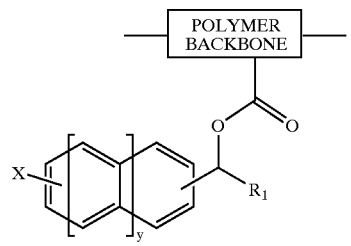

wherein the acid labile group comprises a fused aromatic ring; R1 is an alkyl group having from 2 to 4 carbon atoms; X is a halogen, alkyl, or alkoxy; and y is an integer from 1 to 3, wherein the photosensitive polymer has an average molecular weight ranging from about 3,000 to less than 100,000.

* * * * *